US012787658B2

(12) United States Patent
Desjardins et al.

(10) Patent No.: US 12,787,658 B2
(45) Date of Patent: Nov. 3, 2026

(54) QUANTUM COMPONENT

(71) Applicant: C12 Quantum Electronics, Paris (FR)

(72) Inventors: Matthieu Desjardins, Paris (FR); William Legrand, Paris (FR); Quentin Schaeverbeke, Paris (FR)

(73) Assignee: C12 Quantum Electronics, Paris (FR)

(*) Notice: Subject to any disclaimer, the term of this patent is extended or adjusted under 35 U.S.C. 154(b) by 521 days.

(21) Appl. No.: 18/550,343

(22) PCT Filed: Mar. 11, 2022

(86) PCT No.: PCT/FR2022/050447
§ 371 (c)(1),
(2) Date: Sep. 13, 2023

(87) PCT Pub. No.: WO2022/195205
PCT Pub. Date: Sep. 22, 2022

(65) Prior Publication Data

US 2024/0224817 A1 Jul. 4, 2024

(30) Foreign Application Priority Data

Mar. 14, 2021 (FR) ....................................... 2102507

(51) Int. Cl.
*H10N 60/10* (2023.01)

(52) U.S. Cl.
CPC ................................. *H10N 60/128* (2023.02)

(58) Field of Classification Search
CPC ............... H10N 60/128; H10D 30/402; H10D 48/385; H10D 48/383; H10D 62/121;
(Continued)

(56) References Cited

U.S. PATENT DOCUMENTS

2006/0132051 A1* 6/2006 Fish ..................... G09G 3/3233 315/169.3
2010/0214034 A1 8/2010 Peng et al.
(Continued)

FOREIGN PATENT DOCUMENTS

EP 3066701 A1 9/2016

OTHER PUBLICATIONS

Japanese Notice of Reasons for Refusal for Application No. 2023-578043 dated Nov. 21, 2024, 4 pages.
(Continued)

*Primary Examiner* — Syed I Gheyas
(74) *Attorney, Agent, or Firm* — TraskBritt

(57) ABSTRACT

A quantum component comprises: a substrate; two suspension electrodes; a plurality of gate electrodes arranged between the two suspension electrodes, the two suspension electrodes being raised relative to the gate electrodes; at least one nano-object element, in particular, a nanowire or a nanotube, suspended between the two suspension electrodes, the at least one nano-object element being placed above the gate electrodes, the electrodes of the quantum component comprising: a plurality of low frequency gate electrodes for defining electrostatic potentials in the nano-object element so as to enable at least two quantum dots to be formed in the nano-object element; at least one microwave gate electrode; and wherein at least one electrode comprises a magnetic material, preferably a ferromagnetic material, and is configured so as to apply an inhomogeneous magnetic field to the nano-object element over the spatial extent of the nano-object element.

20 Claims, 3 Drawing Sheets

(58) Field of Classification Search
CPC .... H10D 64/27; H10K 10/482; H10K 10/484; H10K 85/221; B82Y 10/00
See application file for complete search history.

(56) References Cited

U.S. PATENT DOCUMENTS

| | | | | |
|---|---|---|---|---|
| 2016/0285018 | A1* | 9/2016 | Shahal | H10K 10/484 |
| 2019/0018041 | A1* | 1/2019 | Ilani | B82Y 10/00 |
| 2020/0052101 | A1* | 2/2020 | Petta | H10D 64/27 |
| 2021/0028344 | A1 | 1/2021 | Petta et al. | |

OTHER PUBLICATIONS

Pistolesi et al., Proposal for Nanomechanical Qubit, Internet: <URL:https://arxiv.org.pdf / 2008. 10524v1, Aug. 24, 2020, 15 pages.

Tombros et al., Quantized Conductance of a Suspended Graphene Nanoconstruction, Nature Physics, vol. 7, Jun. 5, 2011, pp. 697-700.

Buchs et al., Imaging the Formation of a p-n Junction in a Suspended Carbon Nanotube with Scanning Photocurrent microscopy, Arxiv.org, Cornell University Library, (Sep. 2, 2011, 4 pages.

Churchill et al., Electron-Nuclear Interaction is 13C Nanotube Double Quantum Dots, Arxiv.org, Cornell University Library, (Nov. 19, 2008), 5 pages.

Cottet et al., Spin Quantum Bit with Ferromagnetic Contacts for Circuit QED, Physical Review Letters, Oct. 2010, 6 pages.

Cubaynes et al., Highly Coherent Spin States in Carbon Nanotubes Coupled to Cavity Photons, Quantum Information, Arxiv.org, Cornell University Library, (Mar. 12, 2019), 5 pages.

Duan et al., Dispersive Readout of Reconfigurable Ambipolar Quantum Dots in a Silicon=on-Insulator Nanowire, Arxiv.org, Cornell University Library, (Sep. 29, 2020, 5 pages.

Götz, Georg Thomas Jakob, Single Electron-ics with Carbon Nanotubes, Http://kouwenhovenlab.tudelft.nl/wp-content/uploads/2011/11/thesisGG_.pdf, (Jul. 2, 2010), 136 pages.

International Search Report for International Application No. PCT/FR2022/050447 dated Jul. 7, 2022, 3 pages.

International Written Opinion for International Application No. PCT/FR2022/050447 dated Jul. 7, 2022, 9 pages.

* cited by examiner

QUANTUM COMPONENT

CROSS-REFERENCE TO RELATED APPLICATIONS

This application is a national phase entry under 35 U.S.C. § 371 of International Patent Application PCT/FR2022/050447, filed Mar. 11, 2022, designating the United States of America and published as International Patent Publication WO 2022/195205 A1 on Sep. 22, 2022, which claims the benefit under Article 8 of the Patent Cooperation Treaty of French Patent Application Serial No. FR2102507, filed Mar. 14, 2021.

TECHNICAL FIELD

The present disclosure relates to a quantum component.

BACKGROUND

More particularly, the present disclosure relates to quantum computing architectures, and more specifically, examples of embodiments of an example semiconductor quantum dot device and a method for forming a scalable array of quantum dots.

The quantum component is intended, in particular, but not exclusively, to manufacture a quantum computer.

The density of the transistors in the integrated circuits has followed Moore's law since its conception. However, as the size of transistors approaches the size of a single atom, the laws of quantum physics play an increasingly dominant role in computing architectures, which makes it difficult to continue this trend for longer. Despite this, the prospect of using quantum mechanical phenomena in information processing offers an opportunity to increase the computing power of computers beyond what is known to be possible even in the most ideal conventional computer. Just like the conventional computer depends on the robustness of the transistor, functional quantum computers may require a physical component on a chip with reproducible properties that can be incorporated into large-scale structures.

One of the main candidates for the quantum analog of the transistor is the semi-conductor quantum dot defined by gate electrodes. The spin state of an electron trapped in a quantum dot may be a beneficial physical system for storing quantum information. Silicon ("Si"), in particular, with its weak hyperfine fields, its low spin-orbit coupling and its absence of piezoelectric electron-phonon coupling, forms a "semi-conductor vacuum" for spin states and supports electron spin coherence times of a few seconds. However, the manufacture of reliable, scalable Si-based quantum dots has proved to be difficult. Independently of the need for a pure spin environment, the quantum dots must have electrical properties that are reproducible for scaling. The large effective mass of electrons in Si, as well as the generally lower mobilities of two-dimensional ("2D") Si electron gases Si, make it difficult to manufacture closely confined quantum dots, to a few electrons, with reproducible properties.

The first quantum dot gate architectures were manufactured on substrates doped with gallium arsenide/aluminum gallium arsenide ("GaAs/AlGaAs") wherein the conduction electrons are provided by an overall doped layer and can be confined to the GaAs/AlGaAs quantum well ("QW") interface forming a two-dimensional electron gas ("2DEG"). In these doped structures, by default, the 2DEG is filled with conduction electrons. Therefore, gate designs have attempted to isolate a single conduction electron by manufacturing gate electrodes in a corral model that could potentially create a circular barrier by applying negative voltages to the gates to drain the 2DEG directly under the gates. Devices using this type of gate pattern have been called depletion-mode devices.

Depletion-mode devices have succeeded very well in demonstrating the quantum calculation criteria and are still widely used across the entire community of quantum dots. However, depletion-mode devices have major drawbacks regarding control of the confinement potential and scaling. The gate patterns in depletion-mode devices probably have the most control over the electrostatic potential surrounding the dot, rather than having direct control over the region of space where the electronic wave function resides. This inability to control the electronic wave function has led to a wide variety of depletion-mode gate designs, most of which do not provide a simple path for scaling to tens or hundreds of quantum dots.

The use of quantum points/dots in quantum calculation architectures generally depends on the ability to control the confinement potential of the quantum dot, and more specifically, on the ability to control the physically relevant parameters of the quantum dot (for example, tunnel coupling and electrochemical potential). However, depletion-mode devices have very limited control over confinement potential. Simulations of depletion-mode quantum dot devices have shown that the resulting confinement potential can be much smaller than the dimensions of the gate. Due to such a situation, the neighboring gates generally have a similar effect on the tunnel couplings of the dot and the electrochemical potential, and often it is not possible in depletion-mode devices to adjust the tunnel couplings and electrochemical potential to the desired values without going to voltages so extreme that a dielectric breakdown could occur in the device.

The integration of nano-objects on an electronic component makes it possible to manufacture devices capable of reaching quantum limits. Since quantum behaviors are very sensitive to their environment, it is crucial to have a material of high purity for the engineering of quantum technologies. Carbon nanotubes are materials with exceptional crystallinity, which allows them to also be as mechanically resistant as diamond while having an outstanding electronic conductivity, the electrons being one hundred times more mobile than in silicon. The information may be encoded in quantum form in the spin of an electron, and carbon nanotubes are an ideal host material for these electrons thanks to their high degree of crystalline purity. Carbon nanotubes also have an optical response that covers a visible spectrum up to near infrared depending on the size of their diameter. They are therefore also integrated into optical or optoelectronic devices.

However, these properties are degraded by defects or pollution on the nanotube. The carbon nanotubes also have a diversity of crystalline structure during their growth and tend to agglomerate. The ability to isolate and manipulate a single object without degrading it makes it possible to provide increased control on the behavior of the device using it. Also, the manufacture of electronic circuits with inks or thin layers does not allow optimal control of the characteristics of the manufactured component. The inks also have chemical additives that modify the environment of the nanotube, a problem that is also found in nanotubes in solution. Likewise, integration with electron lithography techniques degrades the crystalline structure of the nanotube due to the use of resin and an electron microscope.

Integrating a single nanotube, without pollution or defects and with known crystalline characteristics, makes it possible to preserve the properties of the nanotubes, and ensures reproducibility and greater control of the devices. In addition, the degradation of the nanotube and the presence of pollution have an impact on the success rate of integration, which depends on the quality of the contact between the nanotube and the target substrate.

Also known from document EP3066701 is a transistor structure comprising an electrode arrangement comprising at least two raised electrodes including at least one source electrode and a drain electrode, and one or more gate electrodes located between the source and drain electrodes, and one or more distinct nanotubes bridging between at least two raised electrodes of the electrode arrangement. One or more distinct nanotubes are suspended between the source and drain electrodes above the one or more gate electrodes, the electrode arrangement is mounted on a cantilever-like tip, and at least one or more of the discrete nanotubes is located at an end portion of the cantilever-like tip.

The document US2021/0028344 discloses a quantum device comprising at least one magnetic field source configured to supply an inhomogeneous magnetic field. An electron performs a back-and-forth movement between at least two quantum states in at least one silicon semiconductor layer in the presence of the inhomogeneous magnetic field. The movement of the electron between the at least two quantum states may generate an oscillating magnetic field to drive a quantum transition between a spin-up state, also known as ½ spin, and a spin-down state, also known as spin −½, of the electron thus implementing a qubit gate on a spin state of the electron. This document proposes a system comprising a signal generator to generate an electrical microwave frequency signal. In conventional electron spin resonance, the spin can be controlled using a magnetic field oscillating at microwave frequency (for example, 10-40 GHz). The oscillating magnetic field is difficult to locate at small scale and is created using milliamp currents (for example, the current refers to one quantum dot and the current passes through a wire close to the dot), which is difficult to scale to a large number of qubits in a cryogenic environment due to the high degree of power dissipated by the current. The disclosed process for driving single-spin rotations is based on shifting the position of an electron in a magnetic field gradient, thereby leading to an effective oscillating magnetic field (for example, and lower power dissipation).

Earlier approaches that induced magnetic oscillations involved the use of unique quantum dots, where the electron is moved by a small amount (for example, about 1 pm) and high electric fields are necessary to obtain such a movement. The method described involves an electrically-driven spin resonance in a double quantum dot. In a double quantum dot, the electron can be moved over a much larger distance, which leads to greater effective oscillating magnetic fields and much faster spin rotation speeds. The faster spin rotation speeds allow the spin to be driven at low microwave powers, which is beneficial in a cryogenic environment. In addition, a quantum computing architecture is disclosed, which combines the electron spin resonance process with two-qubit gates based on an exchange coupling or a cavity coupling, and interactions with ancilla quantum dots for reading the spin state by microwaves.

Finally, the document T. Cubaynes, M. R. Delbecq, M. C. Dartiailh, R. Assouly, M. M. Desjardins, L. C. Contamin, L. E. Bruhat, Z. Leghtas, F. Mallet, A. Cottet and T. Kontos, "Highly coherent spin states in carbon nanotubes coupled to cavity photons," npj Quantum Information, discloses electron-photon coupling based on two non-collinear Zeeman fields on each quantum dot in a double quantum dot, originating from ferromagnetic contacts in a zigzag-shape, the coupling being carried out with a carbon nanotube. These non-collinear Zeeman fields can be obtained by interface exchange fields or by magnetic flux leakage, which both give similar Hamiltonians.

One aim of the present disclosure is to propose a new quantum component architecture making it possible to significantly reduce the quantum misalignment observed in the quantum components of the prior art, and thus to improve the performance of these components.

BRIEF SUMMARY

To this end, and according to a first aspect, the present disclosure proposes a quantum component comprising:

- a substrate,
- at least two suspension electrodes: a source electrode connected to an electron source and a drain electrode connected to a reference potential,
- at least one gate electrode arranged between the two suspension electrodes, the two suspension electrodes being raised relative to the at least one gate electrode,
- at least one nano-object element suspended between the two suspension electrodes, and electrically connected thereto, the at least one nano-object element being placed above the at least one gate electrode, the nano-object element enclosing or comprising at least two quantum dots,
- at least one microwave gate electrode connected to a microwave circuit arranged to carry a microwave signal,
- wherein at least one electrode comprises a magnetic material, referred to as at least one magnetic electrode, and is arranged and configured to apply an inhomogeneous magnetic field to the nano-object element over the spatial extent of the nano-object element.

For the foregoing and for the rest of the description, the terms below have the definitions as follows:

- quantum component, an assembly of electronic circuits and/or devices using nanotubes as conductive or semi-conductive elements thereof, the circuits having single, double or multiple quantum dots, in series or in parallel, using a single nano-object having selected properties as channel elements, or a plurality of separately selected nano-objects;
- a quantum dot, an electron is trapped/confined in three dimensions; it can occupy only discrete energy levels;
- a nano-object, an object having at least one of its external dimensions (typically from its height, width, thickness, length) be less than 100 nanometers; if its three external dimensions (defined along three orthogonal axes) are less than 100 nanometers, then it is a nanoparticle; if two of its external dimensions (preferably defined along two orthogonal axes) are less than 100 nanometers, then that is, for example, a hollow single-wall or multi-wall nanotube, which can be closed at least one end or a nanofiber, that is a solid fiber. An electrically conductive or semi-conductive nanofiber will subsequently be called a nanowire. If an external dimension is less than 100 nm (typically its thickness) then it is a nanosheet;
- an electrode, an end of an electrical conductor arranged to release or capture an electric current;

- a gate electrode, an electrode that transports a microwave signal or which makes it possible to set the potentials (in Volts);
- a microwave gate electrode, a gate electrode that transports and radiates a microwave signal that allows interaction between a microwave cavity and a nano-object;
- a low-frequency gate electrode, a gate electrode that allows electrostatic potentials to be set and to create a double quantum dot;
- electrostatic potentials enabling the formation of the two quantum dots, the electrostatic potentials, which make it possible to modulate the potential energy barriers and to create a double quantum dot;
- Spin-photon coupling, the controllable interaction or "coupling" between the magnetic appearance of the qubit, that is its spin, and a microwave electric field coming from a microwave cavity. As the electric field consists of photons, spin-photon coupling is referred to;
- Quantum gate, a logical operation that can change the state of superposition of a qubit. For example, a qubit can have a one-in-two chance of being in one or the other of the two states;
- an inhomogeneous magnetic field, a magnetic field generated so as to generate a magnetic dipole, preferably by any variation of the magnetic field around and/or along the at least one nano-object element; for example, a vertical and/or horizontal component of the magnetic field changes its sign along or around the at least one nano-object element, preferably at or plumb with the at least one magnetic gate electrode; according to a particular example, a magnetic field gradient that is horizontal or along the at least one nano-object element, which renders the total field inhomogeneous along the at least one nano-object element, preferably the component of the magnetic field along the axis or direction of the at least one nano-object changes its sign along the at least one nano-object element;
- spatial extent, the zone located along and/or around, preferably radially, the at least one nano-object element, preferably between the suspension electrodes, according to one embodiment, an extent corresponding to the distance between two quantum dots;
- purified, in combination with a nano-object, a nano-object that can be composed of a metallic material having a higher purity than 90%, for example, 99.9%;
- substrate, an element of the component having a high resistivity, for example, a higher dielectric constant than air, in particular, at low temperature.

Preferably, the at least one gate electrode comprises the at least one microwave gate electrode.

Preferably, the at least one gate electrode comprises at least one low-frequency gate electrode provided to define the electrostatic potentials allowing the formation of the two quantum dots. Preferably, the low-frequency gate electrodes are superconductive.

According to one embodiment, the magnetic material is a ferromagnetic material, preferably cobalt or palladium-nickel.

Preferably, the at least one electrode comprising a magnetic material is a gate electrode.

Preferably, the at least one gate electrode comprising a magnetic material is a low-frequency gate electrode. The low-frequency gate electrode is provided to define the electrostatic potentials allowing the formation of the two quantum dots.

According to one embodiment, the at least one low-frequency gate electrode has a greater height than the height of a neighboring, or adjacent, low-frequency gate electrode.

According to various embodiments that may be combined with one or more preceding embodiments, at least one electrode, preferably at least one suspension electrode, and/or preferably at least one gate electrode, and/or preferably at least one low-frequency gate electrode may be in the form of a pad or layer.

According to one embodiment of the quantum component, the distance, referred to as the microwave distance, separating the at least one microwave gate electrode from the at least one nano-object element is different from the distance, referred to as the low-frequency distance, separating the at least one low-frequency gate electrode from the at least one nano-object element.

According to one embodiment, the microwave distance is at least 20% less than the low-frequency distance.

Preferably, the microwave distance and the low-frequency distance are vertical distances and/or measured in parallel. They are measured from the same nano-object element.

Preferably, the at least one microwave gate electrode has a relative height relative to the at least one nano-object element different from the height of the at least one low-frequency gate electrode. For the foregoing and for the rest of the description, the height(s) are measured vertically.

According to one embodiment, the at least one microwave gate electrode has a height at least 20% greater than the height of the at least one low-frequency gate electrode, the heights being measured from the face on which the at least one low-frequency gate electrode rests.

The quantum component may be manufactured or provided on a semiconductor substrate. For example, the substrate may be selected from the following list: (i) a silicon/silicon-germanium (Si/SiGe) substrate, (ii) a silicon dioxide on a silicon substrate and/or (iii) a GaAs/AlGaAs heterostructure, and/or (iv) sapphire (v) quartz, or a mixture thereof.

Preferably, the substrate is a high resistivity or insulating substrate, in particular, at low temperature.

According to one embodiment, the quantum component comprises at least one conductive layer arranged on the substrate and under the at least one gate electrode, each gate electrode being separated from the conductive layer by an insulating layer.

According to one alternative embodiment, the conductive layer is arranged under the at least one gate electrode and under the suspension electrodes, each electrode being separated from the at least one conductive layer by an insulating layer. The at least one conductive layer, also called a conductive return layer, is an electrically conductive layer. It may be superconductive. It makes it possible to push back the microwave electromagnetic field toward the nano-object element.

Preferably, the quantum component comprises at least one trench made in at least the conductive layer, the at least one microwave gate electrode being separated from the at least one adjacent gate electrode by the at least one trench.

According to one alternative embodiment, the quantum component comprises at least one trench made in the at least conductive layer, the at least one microwave gate electrode being arranged on the first substrate and being separated from the at least one adjacent gate electrode arranged on the conductive layer by the at least one trench.

Preferably, the substrate is partially hollowed out, so as to extend the at least one trench.

According to the two preceding embodiments, the height of the trench may be equal to the height of the at least one microwave gate electrode. The height of the electrode is measured between the external horizontal face on which the microwave electrode is placed. The height of the trench is measured from the exterior horizontal face on which the gate electrodes are placed to the bottom of the trench.

According to the two embodiments above, the trench may have a rectangular cross section.

The trench makes it possible to reinforce the electromagnetic field scattered by the microwave gate electrode and perceived by the nano-object.

Preferably, the conductive layer is made of an electrical material, for example, ferromagnetic or non-ferromagnetic, so as to push back the microwave electromagnetic field toward the nano-object element.

According to one embodiment, the at least one nano-object element is a two-dimensional or one-dimensional element. Preferably, the at least one nano-object element is at least one nanotube or at least one nanowire. For example, the at least one nano-object element is at least one carbon-nano object element. The carbon nano-objects make it possible for electrons to diffuse at an even greater distance than in a semiconductor layer.

Preferably, the nanotubes, nanowires, also have a collection of properties such as: strong electron-electron interactions, which can generate correlated fundamental electronic states, enable the locating and individual control of the spins and therefore the production of a quantum information chain or charge/spin pumps, and the interaction of the electronic states with the mechanical movement of the nanotubes or other correlated materials.

In this relationship, it should be noted that the term nanotube as used herein refers to single- and double-walled carbon nanotubes, as well as to other types of nanotubes such as semiconductor nanowires (for example, silicon, GaAs, etc.) and other inorganic nanowires (for example, molybdenum disulfide—MoS2).

It should be noted that the technique described above can also provide an electronic device using any number of distinct nanotubes (for example, one to several tens, hundreds, thousands or any number of distinct nanotubes), which are positioned distinctly at the desired locations along a single electrode arrangement. The nanotubes may be arranged in parallel between the at least two raised electrodes and/or may be associated with different sets of electrodes to provide two or more quantum dot structures in a single electronic device. In addition, the arrangement of electrodes may comprise a plurality of sets of raised electrodes arranged parallel to each other, thus enabling a single nanotube to be attached to a plurality of pairs of raised electrodes. This provides a plurality of transistor structures consisting of the same nanotube, thus having a channel with similar characteristics and cleanliness.

Thus, the technique of the present disclosure makes it possible to produce an electronic device comprising one or more transistor structures, so that each transistor structure uses one or more distinct nanotubes being a channel element suspended between a source and drain electrode. One or more gate electrodes may be located between the source and drain electrodes, so that the nanotube is suspended above the gate electrode(s).

The nanotube can be suspended at a height between several microns, or as low as several nanometers above the gate electrodes, for example, the nanotube can be suspended at a height of 50 nanometers above the gate electrodes.

The parameters of the nanotube can be selected to give the transistor structure(s) desired electrical characteristics.

The assembly technique thus offers the possibility of generating electronic devices with great electronic cleanliness compared to commercially available electronic semiconductor devices. By suitably selecting a nanotube with desired properties, the resulting device can considerably remove or reduce electronic disorder within the device.

In addition, the device can be configured with one or more localized gates located under the suspended nanotube.

This makes it possible to form various transistor structures, including transistor structures located on a subpart of the suspended nanotube and thus having active elements distant from the contact metals. This eliminates or at least significantly reduces the noise and capacitive coupling due to nearby metals and consequently considerably improves the electronic characteristics compared to conventional devices. Functioning as a transistor structure, the electronic device can operate as a single electron transistor (SET) and/or as a field effect transistor (FET) depending on the ambient temperature. In addition, the transistor structure can use an electrical trigger to a localized tunable barrier device along the suspended nanotube. Furthermore, the transistor structure can use an electrical trip to generate a single electron quantum dot, or at least two electron quantum dots, along the suspended nanotube, being as short as a few tens of nanometers, as well as a plurality of quantum dots connected in series or in parallel. In addition, the nanotube channel allows a high current along the suspended nanotube.

Preferably, the at least one nano-object element comprises an isotopically purified or enriched material. For example, the material is obtained by CVD (Chemical Vapor Deposition) from an isotopically purified or enriched gas source.

According to one embodiment, the at least one gate electrode is arranged and configured to create a polarization of the spin of an electron, which is non-collinear between two quantum dots formed in the nano-object element. Preferably, the at least one low-frequency gate electrode is arranged and configured to create a polarization of the spin of an electron, which is non-collinear between two quantum dots formed in the nano-object element.

The at least one gate electrode further comprises means for creating a polarization of the spin of an electron, which is non-collinear between two quantum dots formed in the nano-object element. Preferably, the at least one low-frequency gate electrode further comprises means for creating a polarization of the spin of an electron, which is non-collinear between two quantum dots formed in the nano-object element.

The quantum component may further have the following feature(s):

- the distance separating the at least one gate electrode from the at least one suspended nano-object element is 100 nanometers,
- the height of the at least one gate electrode, advantageously the at least one low-frequency gate electrode, is greater than the distance separating the at least one gate electrode from the at least one suspended nano-object element,
- the distance horizontally separating two gate electrodes is 200 nanometers, the endpoints being located at the center of each electrode,
- the at least one gate electrode comprises or is made of a high-magnetization material,
- the at least one gate electrode comprises or consists of a single layer of material or of a plurality of layers of material, the material comprises or consists of a material selected from the following list: cobalt, nickel, palladium, or a mixture thereof, preferably a mixture of palladium and nickel, or a mixture of palladium and cobalt.

According to other optional embodiment(s) that may or may not be combined, in particular, with the preceding features, the quantum component comprises:

at least one gate electrode is made of a ferromagnetic or anti-ferromagnetic or magnetic multilayer material, preferably at least one low-frequency gate electrode made of a ferromagnetic or anti-ferromagnetic or magnetic multilayer material, preferably at least one microwave gate electrode made of a ferromagnetic or anti-ferromagnetic or magnetic multilayer material;

the at least one gate electrode and/or the at least two suspension electrodes is made or are made of a ferromagnetic or anti-ferromagnetic or magnetic multilayer material;

at least one magnetic electrode, which can further be configured to create a polarization of the spin of an electron, which is non-collinear between two quantum dots formed in the nano-object;

at least one magnetic gate electrode, which can further be configured to create a polarization of the spin of an electron, which is non-collinear between two quantum dots formed in the nano-object;

means for applying a homogeneous magnetic field allowing a polarization of the at least one magnetic electrode, preferably of the at least one low-frequency gate electrode;

means for applying a homogeneous magnetic field allowing a polarization of the at least one magnetic gate electrode, preferably of the at least one low-frequency gate electrode;

according to one embodiment, the means comprise at least one coil, preferably arranged around the at least one gate electrode, advantageously the quantum component is arranged at the center of the coil in order to apply a homogeneous magnetic field;

control means for controlling the quantum component, the at least one microwave gate electrode being connected to a microwave circuit arranged to carry a microwave signal;

according to one alternative embodiment, the at least one microwave gate electrode comprises means, called control means, for controlling the quantum component, the at least one microwave gate electrode being connected to a microwave circuit arranged to carry a microwave signal;

preferably the control means are capacitive coupling means, so as to electromagnetically couple the component to the microwave circuit;

the at least one microwave gate electrode allowing control of the quantum component, this microwave electrode being connected to a microwave circuit arranged to transport a microwave signal, for example, quantum or non-quantum signal;

coupling means for coupling a plurality of quantum components, the at least one microwave gate electrode being connected to a microwave circuit arranged to carry a microwave signal;

according to one alternative embodiment, the at least one microwave gate electrode comprises means, called coupling means, for coupling a plurality of quantum components, the microwave gate electrode being connected to a microwave circuit arranged to carry a coupling microwave signal;

preferably the coupling means are capacitive coupling means, so as to electromagnetically couple the components to the microwave circuit;

the at least one electrode may comprise a material selected from the following list: cobalt, iron, nickel, palladium, alloys thereof, a multi-ferroic material or a combination thereof, preferably cobalt or a palladium-nickel alloy. Any other magnetic material can be used.

The microwave circuit is for example, a microwave resonator.

According to a second aspect, the present disclosure proposes an electronic device comprising at least one quantum component according to one or more of the features of the first aspect.

According to a third aspect, the present disclosure proposes a method for controlling a quantum component, comprising: —defining, using one or more nano-object elements, at least two quantum states in at least one nano-object, the at least two quantum states being in an inhomogeneous magnetic field, and—causing, on the basis of a microwave oscillating electrical signal carried by a microwave electrode, the back-and-forth movement of an electron between the at least two quantum states in the presence of the inhomogeneous magnetic field, the movement of the electron generating an oscillation of the magnetic field to drive a quantum transition between a spin state oriented in one direction and a spin state oriented in an opposite direction of the electron, thus implementing a qubit gate on a spin state of the electron.

Preferably, the method controls a quantum component according to one or more of the features of the first aspect.

BRIEF DESCRIPTION OF THE DRAWINGS

Other features and advantages of the present disclosure will emerge from the following detailed description of the present disclosure with reference to the accompanying figures, and in which.

For greater clarity, identical or similar elements of the various embodiments are denoted by identical reference signs in all of the figures.

DETAILED DESCRIPTION

Figure 1:
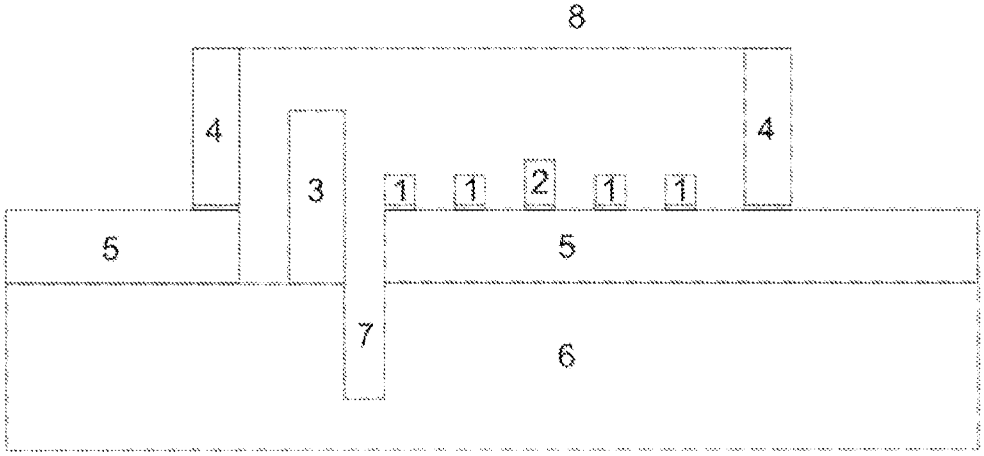
FIG. 1 shows a diagram of a quantum component seen in cross-section, according to a first embodiment.

In relation to FIG. 1, an embodiment of a quantum component is shown comprising:

a substrate 6, made of a high resistivity material, for example, silicone, or silicon, a layer of an electrical material 5, made of a conductive material, for example, niobium, arranged on the substrate 6, gate electrodes 1, 2 (by way of illustration, five gate electrodes are shown: 4 low-frequency gate electrodes and one magnetic electrode 2), the gate electrodes being placed on the conductive layer 5 via an insulating layer, two suspension electrodes 4 (by way of illustration, two suspension electrodes are shown), a source electrode connected to an electron source and a drain electrode connected to a reference potential, the suspension electrodes being placed on the conductive layer 5 via an insulating layer, and on either side of the group of gate electrodes, the suspension electrodes being raised relative to the gate electrodes, a nanotube or a nanowire 8 connected to the two suspension electrodes 4, the nanotube or the nanowire being suspended rectilinearly above the gate electrodes, the nanotube or the nanowire being preferably made of carbon, a gate electrode called a microwave gate electrode 3 connected to a microwave circuit (not shown) arranged to carry a microwave reading signal intended to be processed and to deliver the state of the quantum component, the microwave gate electrode 3 being placed on the substrate 6 and is separated from the adjacent gate electrode, called a low-frequency gate electrode, by a trench 7.

According to one embodiment, the width of the electrode 2 has a distance or dimension less than or equal to half the distance separating the gate electrode 2 from the adjacent gate electrode 1. Preferably the width of the gate electrode 2 is between 50 and 250 nanometers.

According to other embodiments not shown, the quantum component may comprise a plurality of gate electrodes 2, for example, at least two gate electrodes 2. For example, the at least two gate electrodes 2 can be arranged in alternating fashion relative to the gate electrodes 1.

Preferably, the trench 7 passes through the thickness of the conductive layer 5, so that the total depth of the trench is substantially equal to the height of the microwave gate electrode 3.

Figure 2:
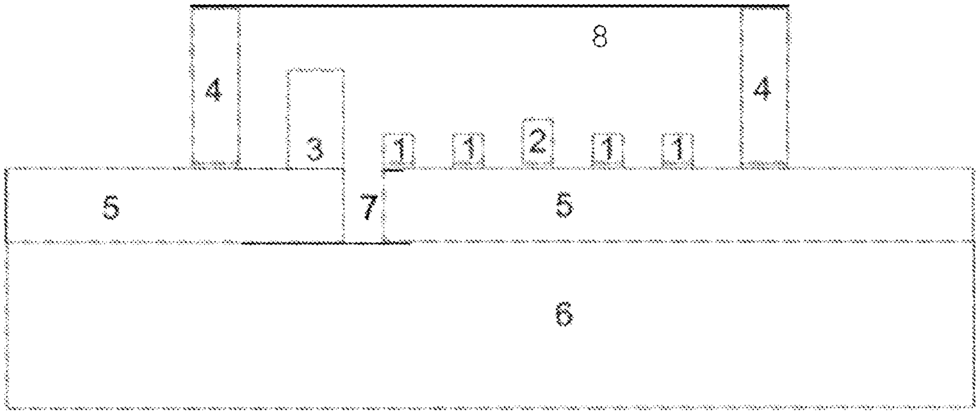
FIG. 2 shows a diagram of a quantum component seen in cross-section, according to a second embodiment.

According to an alternative embodiment shown by the FIG. 2, the trench 7 passes through only the thickness of the conductive layer 5. The microwave gate electrode 3 is disposed on the conductive layer 5 via an insulating layer.

Figure 3:
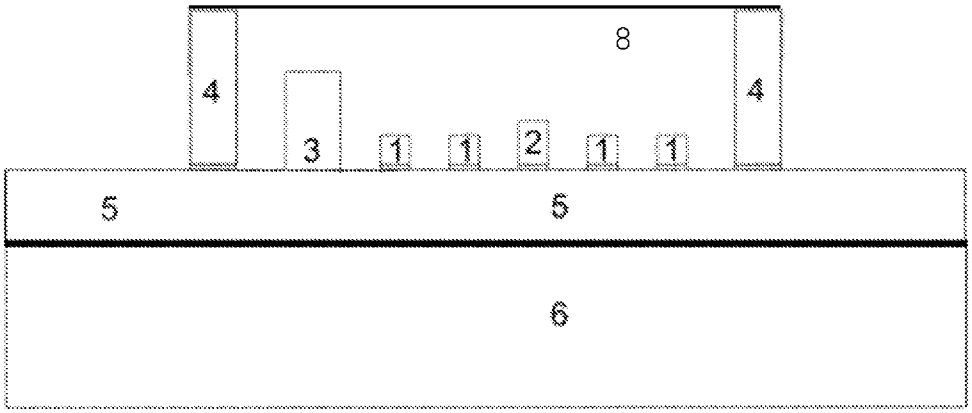
FIG. 3 shows a diagram of a quantum component seen in cross-section, according to a third embodiment.

According to yet another alternative embodiment shown by FIG. 3, the quantum component does not comprise a trench.

Figure 4:
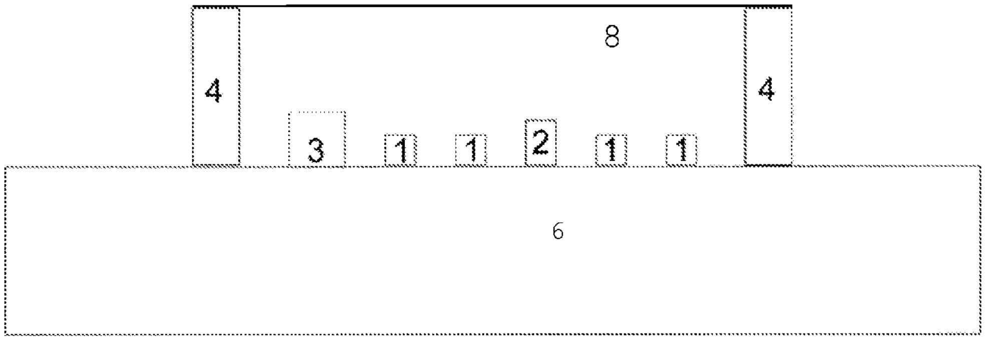
FIG. 4 shows a diagram of a quantum component seen in cross-section, according to a fourth embodiment.

According to a simplified alternative embodiment shown by FIG. 4, the quantum component comprises a single substrate 6, no trench, and, in particular, a magnetic gate electrode 2 made or covered with a ferromagnetic material, preferably cobalt. Furthermore, the electrode 2 has a greater height than the low-frequency gate electrodes 1 arranged in its vicinity. Optionally, this feature can be combined with the embodiments shown by the preceding figures. This feature makes it possible to polarize the nano-object and magnetize the spins of the nano-object by a dipole field.

Figure 5:
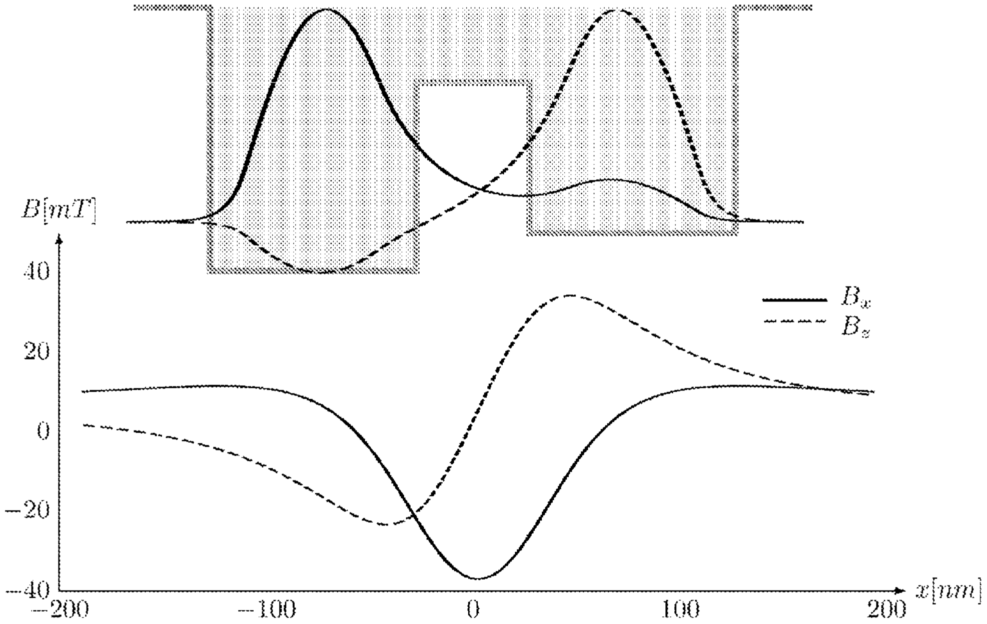
FIG. 5 shows two graphs one above the other, the top graph showing on the one hand in a solid gray line the electrostatic potential in a nanotube as a function of the distance in nanometers, and on the other hand via the black lines, the two binding (black solid line) and antibinding (black dotted line) states of an electron in a double quantum dot, and the graph of the bottom showing the profile of two magnetic flux leakage components.

Referring to FIG. 5, the wave functions of a double quantum well as well as the magnetic field profile created by a pad or gate electrode of a quantum component according to one embodiment are shown.

With reference to the upper or top graph, the two-state wave functions are shown in a double quantum dot, in particular, the electrostatic potential in the nanotube as a function of the axis x in nanometers. The electrostatic potential (shown as a gray solid line) makes it possible to form these two quantum dots. The potential profile is the result of the voltages applied to the gate electrodes. According to the cases shown in the Figures, in particular, FIG. 1, the high voltages at the middle and on the edge are created by the central gate electrode 2 and the outermost two gate electrodes 1. The low voltage is created by the two gate electrodes 1 on either side of the gate electrode 2. This potential profile creates a double quantum dot, shown by the gray area. The black lines show the two binding (solid line) and antibinding (dotted line) states of an electron in a double quantum dot, hosted, for example, in a carbon nanotube (not shown).

With reference to the lower or bottom graph, the magnetic field profiles created by a Cobalt ferromagnetic gate electrode are shown. The magnetic simulation was carried out for a Cobalt electrode 100 nanometers tall, 200 nanometers wide. The profile of two magnetic field components corresponds to the leakage field generated 100 nanometers above the Cobalt electrode, which corresponds to the height of the nano-object relative to this electrode. The Cobalt electrode is polarized by a homogeneous 300 mT magnetic field in the direction x (axis of the double quantum dots and the nanotube). The component Bz (dashed line) generates a non-uniform magnetic field (field gradient), for example, the component Bz is strictly greater than 15 mT. The convolution of this inhomogeneous field with the shape of the wave function of the quantum state (upper graph) gives the value of the non-collinear polarization, which allows the coupling of the spin to the microwave. Preferably, the suspended material is pure and the central gate electrode is a cobalt bar. Furthermore, preferably, there is no use of a ferromagnetic drain source electrode to create the non-collinear polarization. This makes it possible to move the quantum dots away from the source and drain electrodes and thus decrease the noise generated by these electrodes. This makes it possible to more closely approach the ideal system of a suspended nano-object. This example makes it possible to propose a quantum component that outperforms the components of the prior art.

The invention claimed is:

1. A quantum component, comprising:

a substrate;

at least two suspension electrodes including a source electrode connected to an electron source and a drain electrode connected to a reference potential;

at least one gate electrode arranged between the two suspension electrodes, the two suspension electrodes being raised relative to the at least one gate electrode;

at least one nano-object element suspended between the two suspension electrodes, and electrically connected thereto, the at least one nano-object element being placed above the at least one gate electrode, the nano-object element comprising at least two quantum dots;

at least one microwave gate electrode connected to a microwave circuit arranged to carry a microwave signal; and at least one magnetic electrode comprising a magnetic material arranged and configured to apply an inhomogeneous magnetic field to the nano-object element over a spatial extent of the nano-object element.

2. The quantum component of claim 1, wherein the magnetic material is a ferromagnetic material.

3. The quantum component of claim 1, wherein the at least one magnetic electrode is at least one low-frequency gate electrode.

4. The quantum component of claim 3, wherein the at least one low-frequency gate electrode has a greater height than a height of a neighboring low-frequency gate electrode.

5. The quantum component of claim 3, wherein a distance, referred to as a microwave distance, separating the at least one microwave gate electrode from the at least one nano-object element is different from a distance, referred to as a low-frequency distance, separating the at least one low-frequency gate electrode from the at least one nano-object element.

6. The quantum component of claim 5, wherein the microwave distance is at least 20% less than the low-frequency distance.

7. The quantum component of claim 1, further comprising at least one conductive layer arranged on the substrate and under the at least one gate electrode, each gate electrode being separated from the conductive layer by an insulating layer.

8. The quantum component of claim 1, further comprising at least one conductive layer arranged on the substrate and under at least one gate electrode, and at least one trench in at least the conductive layer, the at least one microwave gate electrode being separated from the at least one gate electrode by the at least one trench.

9. The quantum component of claim 1, further comprising at least one conductive layer arranged on the substrate and under at least one gate electrode, and at least one trench in at least the conductive layer, the at least one microwave gate electrode being disposed on the substrate and being separated from the at least one gate electrode disposed on the conductive layer by the at least one trench.

10. The quantum component of claim 9, wherein the substrate is partially hollowed out, so as to extend the trench.

11. The quantum component of claim 8, wherein a height of the trench is equal to a height of the at least one microwave gate electrode.

12. The quantum component of claim 1, wherein the at least one nano-object element is at least one nanotube or at least one nanowire.

13. The quantum component of claim 1, wherein the at least one nano-object element comprises an isotopically purified or enriched material.

14. The quantum component of claim 1, wherein the at least one magnetic electrode is arranged and configured to create a polarization of the spin of an electron which is non-collinear between two quantum dots formed in the nano-object element.

15. The quantum component of claim 14, further comprising means for applying a homogeneous magnetic field for polarizing the at least one magnetic electrode.

16. The quantum component of claim 1, wherein the at least one microwave gate electrode further comprises means for controlling the quantum component, the at least one microwave gate electrode being connected to a microwave circuit arranged to carry a microwave signal.

17. The quantum component of claim 1, wherein the at least one microwave gate electrode further comprises means for coupling a plurality of quantum components, the at least one microwave gate electrode being connected to a microwave circuit arranged to carry a coupling microwave signal.

18. An electronic device comprising at least one quantum component according to claim 1.

19. The quantum component of claim 2, wherein the ferromagnetic material, comprises cobalt or palladium-nickel.

20. A method for controlling a quantum component, comprising:

defining, using one or more nano-object elements, at least two quantum states in at least one nano-object, the at least two quantum states being in an inhomogeneous magnetic field; and causing, on the basis of a microwave oscillating electrical signal carried by a microwave gate electrode, back-and-forth movement of an electron between the at least two quantum states in the presence of the inhomogeneous magnetic field, the movement of the electron generating an oscillation of the magnetic field to drive a quantum transition between a spin state oriented in one direction and a spin state oriented in an opposite direction of the electron, thus implementing a qubit gate on a spin state of the electron.

* * * * *